US006713832B2

(12) United States Patent
Pardo et al.

(10) Patent No.: US 6,713,832 B2
(45) Date of Patent: Mar. 30, 2004

(54) VERTICAL METAL-SEMICONDUCTOR MICRORESONATOR PHOTODETECTING DEVICE AND PRODUCTION METHOD THEREOF

(75) Inventors: Fabrice Pardo, Vitry-sur-Seine (FR); Stéphane Collin, Paris (FR); Roland Teissier, Fontenay aux. Roses (FR); Jean-Luc Pelouard, Paris (FR)

(73) Assignee: Centre National de la Recherche Scientifique, Paris (FR)

( * ) Notice: Subject to any disclaimer, the term of this patent is extended or adjusted under 35 U.S.C. 154(b) by 0 days.

(21) Appl. No.: 10/169,726

(22) PCT Filed: Jan. 12, 2001

(86) PCT No.: PCT/FR01/00103
§ 371 (c)(1),
(2), (4) Date: Jul. 15, 2002

(87) PCT Pub. No.: WO01/52329
PCT Pub. Date: Jul. 19, 2001

(65) Prior Publication Data
US 2003/0010979 A1 Jan. 16, 2003

(30) Foreign Application Priority Data
Jan. 14, 2000 (FR) ............................................ 00 00468

(51) Int. Cl.$^7$ .................. H01L 31/0224; H01L 31/0304
(52) U.S. Cl. ...................... 257/459; 257/189; 257/448; 257/457; 257/615
(58) Field of Search .............................. 257/184, 189, 257/443, 448, 449, 457, 459

(56) References Cited

U.S. PATENT DOCUMENTS

| 5,227,648 A | | 7/1993 | Woo |
| 5,512,763 A | * | 4/1996 | Allam .......................... 257/459 |
| 5,631,490 A | * | 5/1997 | Dutta et al. .................. 257/457 |
| 5,945,720 A | | 8/1999 | Ishii et al. |

FOREIGN PATENT DOCUMENTS

GB 2 100 511 12/1982

OTHER PUBLICATIONS

S.Y. Chou et al.: "Nanoscale tera-hertz metal-semiconductor-metal photodetectors" IEEE Journal of Quantum Electronics, vol. 28, No. 10, pp. 2358–2368, Oct. 1, 1992.
U. Prank et al.: "Metal-semiconductor-metal photodetector with integrated fabry-perot resonator for wavelength demultiplexing high bandwidth receivers" Applied Physics Letters, vol. 62, No. 2, pp. 129–130, Jan. 11, 1993.
C. Daboo et al.: "Surface-plasmon-enhanced photodetection in planar AU-GAAS schottky junciions" Thni Solid Films, vol. 189, No. 1, pp. 27–38, Aug. 1, 1990.
J. Melendez et al.: "Development of a surface plasmon resonance sensor for commercial applications" Sensors and Actuators, vol. 39, No. 1–3, pp. 375–379, Mar. 1, 1997.

* cited by examiner

*Primary Examiner*—Gene M. Munson
(74) *Attorney, Agent, or Firm*—Oblon, Spivak, McClelland, Maier & Neustadt, P.C.

(57) ABSTRACT

Device for photodetection with a vertical metal semiconductor microresonator and procedure for the manufacture of this device.

According to the invention, in order to detect an incident light, at least one element is formed over an insulating layer (2) that does not absorb this light, including a semiconductor material (6) and at least two electrodes (4) holding the element, with the element and electrode unit being suitable for absorbing this light and designed to incease the light intensity with respect to the incident light, in particular by making a surface plasmon mode resonate between the unit interfaces with the layer and the propagation medium for the incident light, with the resonance of this mode taking place in teh interface between the element and atleast one of the electrodes, with this mode being excited by the component of the magnetic field of the light, parallel to the electrodes. Application for optical telecommunications.

22 Claims, 4 Drawing Sheets

VERTICAL METAL-SEMICONDUCTOR MICRORESONATOR PHOTODETECTING DEVICE AND PRODUCTION METHOD THEREOF

TECHNICAL FIELD

The present invention concerns a photodetection device as well as a procedure for the manufacture of this device.

As will be seen better as follows, the device that is the objective of the present invention offers a wide range of selection for the wave length, extreme speed and great sensitivity.

It is applicable to any field liable to take advantage of at least one of these qualities such as, for example, the microscopic detection of molecules and, more specifically, very high speed optical telecommunications, greater than or equal to 100 Gbits per second.

PRIOR STATE OF THE ART

MSM (Metal-Semiconductor-Metal) type photodetectors are generally quite simple to manufacture, they are easily fitted into field effect transistors and allow relatively high speed to be obtained but to the detriment of performance. Hereinafter, some MSM photodetectors are considered that are known as well as their drawbacks.

In a known photodetector based on InGaAs, whose distance between the electrodes is 1 $\mu$m, the transit time of the holes is around 10 ps, which corresponds to a cut-off frequency of less than 20 GHz. Therefore the distance between the electrodes must be reduced in order to cut down the transit time for the holes. When the distance between the electrodes drops below 0.1 $\mu$m, the transport can no longer be considered as stationary. The transit time then becomes much lower than 1 ps.

The masking of the active zone by the electrodes is one of the main drawbacks of the known MSM structures and limits their quantum yield. Furthermore, because of the limited absorption of the materials used in these structures (the length of absorption is greater than 1 $\mu$m), the thickness of the absorption zone must be limited so as to prevent the creation of charge carriers far away from the electrodes. The quantum efficiency of the known photodetectors, since they have a range between the electrodes of less than 0.1 $\mu$m, is therefore extremely bad.

On the contrary, the known MSM structures, whose external quantum yield is good, have a low speed.

But nowadays a super-fast photodetector (whose response time is less than 1 ps) is a crucial element for very high speed optical telecommunications (100 Gbits/s and above). The performance levels sought include great sensitivity and broadband, at wavelengths between 1.3 $\mu$m and 1.55 $\mu$m. Whatever type of photodetector it may be (P(I)N diode or Metal-Semiconductor-Metal structure), the target of high speed forces the distance between the electrodes to be short (less than 100 nm) and that the light to be detected must be absorbed in a minimum volume.

Hence, the bulk InGaAs semiconductor has a characteristic absorption length of around 3 $\mu$m at a wavelength of 1.55 $\mu$m.

In the PIN diodes and in the MSM structures, the reduction of the transit time for the charge carriers is directly linked to a drop in the external quantum yield.

The design of the known photodetectors therefore is necessarily the subject of a compromise between yield and speed.

OVERVIEW OF THE INVENTION

The device that is the subject of the invention aims to radically question this compromise and uses a vertical microresonator, which allows, for example, a quantum yield of over 70% to be attained in a low capacity structure, whose range between the electrodes may be less than 50 nm and may lead to a bandwidth of over 1 THz.

The principle for a device in accordance with the invention consists of concentrating the light that we may wish to detect in a resonant manner, in a low volume MSM type structure, by using the fast drop in evanescent modes excited in the Metal/Semiconductor interface.

The surface plasmon modes allow this aim to be achieved.

Unlike the known structures, the plasmons do not spread horizontally (that is to say in parallel to the substratum of the structure), but rather they remain confined along the vertical surface of the electrodes in the structure.

In a precise manner, the aim of the present invention is a photodetection device intended to detect an incident light with a predefined wavelength, propagating in a propagation medium, with this device being characterised by the fact that it includes an electrically insulating layer that does not absorb this light and, on this layer, at least one element, including a semiconductor material, and at least two biasing electrodes, intended to be carried respectively to potentials that are different from one another, with the electrodes surrounding the element, with the set formed by the element and the electrodes being adapted to absorb the incident light (in other words, the element and/or the electrodes are suitable for absorbing this light), with the element and the electrodes having a shape that is substantially parallelepipedal and extending following the same direction, with the dimmensions of the electrodes and the element, counted transversally to this direction, being chosen according to the predefined wavelength, in such a way as to increase the light intensity in the set formed by the element and the electrodes with respect to the incident light, by making at least one of two modes resonate, that is to say a first mode which is a surface plasmon mode and which made to resonate between the interfaces that this set includes with the insulating layer and the propagation medium, with the resonance of this first mode taking place at the interface between the element and at least one of the electrodes, with this first mode being excited by the component of the magnetic field associated with the incident light, a component that is parallel to the electrodes, and a second mode which is a transverse electrical mode of an optical waveguide which is perpendicular to the insulating layer and includes the two electrodes, with this second mode being excited by the component of the electric field associated with the incident light, a component which is parallel to the electrodes.

Preferentially, when the surface plasmon mode is made to resonate, the width of each element, counted perpendicularly to the direction of the electrodes, is less than $\lambda$ and greater than $0.02 \times \lambda$, where $\lambda$ is the wavelength of the incident light and the thickness of each element is less than $\lambda/(2n)$, where n is the average refractive index for each element.

According to a first particular form for building the device that is the subject of the invention, the electrodes are made of the same electrically conductive material and are the same height, counted perpendicularly to the insulating layer.

According to a second particular form for building it, the electrodes have at least one of the following two properties (a) they are made of different electrically conductive materials and (b) they have different heights, counted perpendicularly to the insulating layer, in such a way that the resonance takes place essentially on the side of the electrode which collects the slow charge carriers at the time of the biasing of the electrodes.

The element that the device carries may include a semiconductor heterostructure.

According to a particular mode for its construction, the device that is the subject of the invention includes several elements and electrodes that alternate on the insulating layer, with each electrode being made of a single metal or of two different metals.

In this case, in a first particular mode for its implementation, the electrodes are intended to be carried to potentials which grow from one end electrode to the other end electrode in the set of electrodes.

The device that is the subject of the invention may then also include a resistive material, for stabilising potentials, which is in contact with the electrodes and runs from one end electrode to the other end electrode in the set of electrodes. The latter allows the set of elements to be polarised under a high voltage.

In a second particular mode for its implementation, the electrodes are intended to be carried to potentials whose absolute values are equal and whose signs alternate.

According to a preferred mode for the implementation of the device that is the subject of the invention, this device also includes a means for reflection planned to reflect the light that is not absorbed, crossing the insulating layer, with the thickness of this insulating layer being chosen so that the light reflected by the means for reflection will be in phase with the light waves present in the set formed by each element and the electrodes and will participate in the resonance.

In a first example, the device that is the subject of the invention is intended to detect an incident light whose wavelength is approximately 0.8 $\mu$m, this device is formed on a substratum of GaAs, the element is made of GaAs, the electrodes are made of Ag, the insulating layer is made of AlAs, or out of an $Al_xGa_{1-x}As$ material, with x being chosen in such a way that this material will not absorb the incident light but will allow a selective etching of the GaAs, and the reflection means is a multiple layer AlAs/AlGaAs mirror.

In a second example, the device is intended to detect an incident light whose wavelength is approximately 1.55 $\mu$m, this device is formed on a substratum made of InP, the element is made of InGaAs, the electrodes are made of Ag, the insulating layer is made of AlInAs and the means for reflection is a multiple layer mirror made of GaInAsP/InP or AlGaInAs/AlInAs. As a variation, the device is formed on a GaAs substrate, with the element being made of an InGaAsNSb alloy, the electrodes are made of Ag, the insulating layer is made of AlAs, or in an $Al_xGa_{1-x}As$ material, with x being chosen in such a way that this material will not absorb the incident light but will allow a selective etching of the GaAs, and the reflection means is a multiple layer GaAs/AlAs mirror.

In a third example, the device is intended to detect an incident light whose wavelength belongs to the infrared range, and the electrodes are mainly made of Ag or Au in order to absorb the incident light, with the element not absorbing this incident light.

According to a first particular mode for implementing the invention, the propagation medium is air.

According to a second particular mode for implementation, the propagation medium is a light guide parallel to the direction in which the electrodes from each element spread out.

The present invention also concerns a procedure for manufacturing the device that is the subject of the invention, in which a given thickness of the semiconductor material for the element is made to grow on the insulating material, this semiconductor material is etched selectively in order to remove from it portions in the sites corresponding to the electrodes and these electrodes are formed on these sites.

According to a first particular mode for implementing the procedure that is the subject of the invention, the same mask is used to selectively etch the element and then to form the electrodes.

According to a second particular mode for implementing the procedure that is the subject of the invention, a mask is used to selectively etch the element, this mask is removed, the electrodes are formed using at least one metal and the excess material from this metal is removed by means of mechanical or mechanical-chemical polishing.

In this case, according to a particular mode for implementing the invention, the excess metal is removed by means of a selective mechanical or mechanical-chemical polishing of the metal with respect to the element, with this element being made up by a material whose hardness is great compared to that of the metal.

According to a particular mode for implementation, the element includes an upper layer and the excess metal is removed by means of a selective mechanical or mechanical-chemical polishing of the metal with respect to the element, with the upper layer of the element being made up by a material whose hardness is great compared to that of the metal.

Two metals may also be used in order to form the electrodes and deposited successively in an oblique manner with respect to the insulating layer.

It should be noted that, in the present invention, the use of a large number of elements amongst which some electrodes are deposited, instead of the use of a single element placed between two electrodes, allows a network to be built whose electromagnetic modelling is very much simpler.

Then it may be shown that the first mode is made to resonate, which corresponds to some vertical plasmons that are weakly coupled two by two.

The lower and upper ends of the vertical sides of the electrodes have a mirror effect on the plasmons in the metal-semiconductor interface, which allows a Fabry-Pérot type of resonance to be established and so absorb the largest part of the TM (transverse magnetic) polarised incident wave.

The modelling has also allowed the same Fabry-Pérot type resonance phenomenon to be demonstrated for the TE (tranverse electrical) modes of the flat wave guide formed between two electrodes separated by an element and so absorb the largest part of the TE polarised incident light for some suitably chosen parameters of the device.

In the case of TM polarisation and in the case of TE polarisation, total absorption may be obtained by using a Bragg mirror under the electrodes to reflect the wave transmitted in the insulating layer.

The figures for the drawings attached herewith show that, unlike the excitation of horizontal surface plasmons (that is to say those parallel to the insulating layer), the resonance is barely sensitive to the inclination of the incident light wave that we want to detect. It is therefore possible to focus the light wave strongly onto the device and to only activate a small number of elements (for example, 3 to 5), whilst reducing the quantum yield of the device by very little (with respect to the case in which a large number of elements are used).

Furthermore, in the case of TM polarisation, it is recommended that the thickness of each element should be produced accurately whilst that is not the case for the transversal dimensions of each element and of the electrodes.

BRIEF DESCRIPTION OF THE DRAWINGS

The present invention shall be better understood after reading the description of the examples for the implementation provided below, purely for information purposes and not at all limited thereto, by referring to the drawings attached herewith, on which.

DETAILED DESCRIPTION OF THE PARTICULAR MODES FOR IMPLEMENTATION

Figure 1:
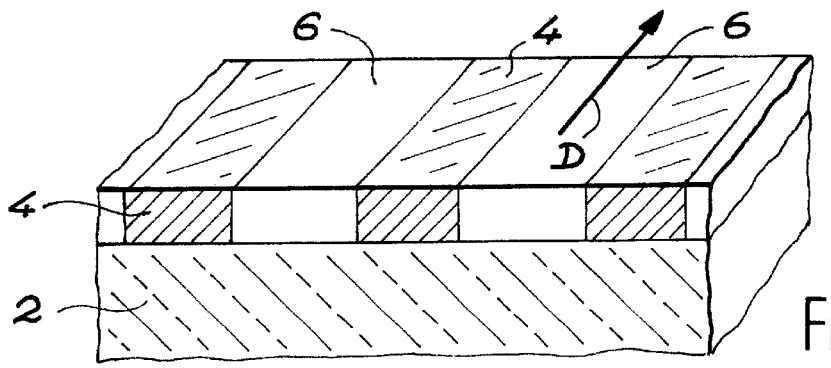
FIG. 1 is a schematic and partial perspective view of a device in accordance with the invention.

A device in accordance with the invention is to be seen from a diagram type and partial perspective on FIG. 1. It involves a structure forming a network of metal-semiconductor-metal detectors, also abbreviated as MSM, which is set out on an electrically insulating layer 2.

This network is a set of metal electrodes 4 which alternate with some semiconductor elements 6.

These electrodes and these elements have an approximately parallelepipedal shape and spread out following the same direction D on the layer 2.

In the example in FIG. 1, there are several semiconductor elements. In a variation that is not shown, a single semiconductor element is used 6 set out between two electrodes 4.

Figure 2:
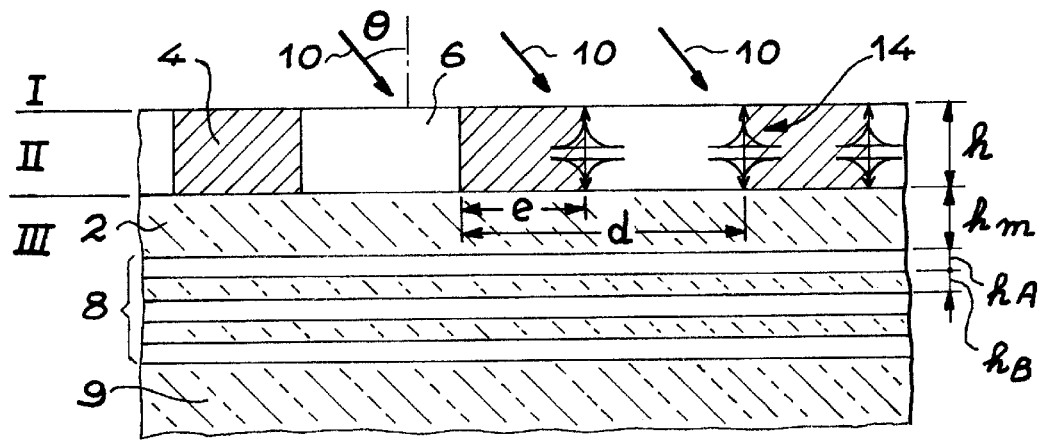
FIGS. 2 and 3 are schematic and partial cross-sections of other devices in accordance with the invention.

Another device in accordance with the invention is seen as a schematic and partial transversal cross-section view in FIG. 2. This device in FIG. 2 is identical to the one in FIG. 1 apart from the fact that it also includes a multiple layer mirror 8 also called a Bragg mirror.

This multiple layer mirror is an alternating stack of layers of materials that do not absorb light, with different refractive indices $n_A$ and $n_B$. The respective thicknesses $h_A$ and $h_B$ of these layers are calculated according to the range of wavelengths to be reflected.

It may also be seen that the device in FIG. 2 is formed on a substratum 9. The mirror 8 is built between this substratum and the layer 2.

The device in FIG. 2 (and therefore the device in FIG. 1) may be broken down into three zones, I, II and III.

As follows, it is assumed that the incident light wave 10 that we want to detect with the device reaches the latter through zone I made up by air.

Figure 3:
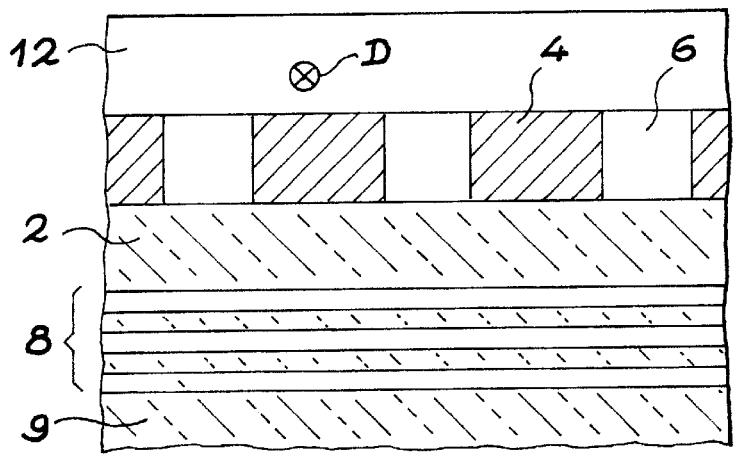

The case of a device according to the invention may be described in a similar manner which is placed in contact with a light wave guide in which a light to be detected with the device is propagated. This case is illustrated in a diagram and partial form in FIG. 3 where the guide has reference 12. This guide 12 stretches out following the direction D and then in parallel to the electrodes 4 and the semiconductor elements 6.

Going back to FIG. 2, zone II is made up by the network of the metal electrodes 4 having a transversal cross-section that is approximately rectangular and the elements 6 made up by a semiconductor that absorbs the incident light, with the wavelength of this light being known.

In a variation which is not shown, each element 6 is made up by a layer of a semiconductor material which absorbs the incident light and a dielectric layer which lines this layer of semiconductor material.

Zone III corresponds to the layer 2 which is made up by a non-absorbent semiconductor in a mesh layout with the semiconductor in zone II. This zone III may, as has been seen, include a Bragg mirror which reflects the light waves transmitted from zone II to zone III.

The incident light to be detected 10 that may be broken down into polarised TM light and into polarised TE light, reaches the structure through zone I. The polarised TM light excites the surface plasmon modes along the interface between the metal and the semiconductor in zone II. The waves corresponding to these modes are then reflected to the interfaces in zones II/III and II/I.

This resonance phenomenon for a TM polarisation is shown in a diagram form in FIG. 2 where the resonant surface plasmons 14 have been symbolised.

The height $h_m$ between the II/III interface and the Bragg mirror 8 is calculated in such a way that the wave transmitted from zone II to zone III and reflected by this mirror 8 is in phase with the waves (plasmons) in the medium II and participates in the resonance.

The TE polarised light excites the modes of the flat wave guide between two electrodes 4. These modes are also reflected to the II/III and II/I interfaces and the waves transmitted in zone II are reflected by the Bragg mirror 8.

The working of the device is then similar to that of a classic MSM structure.

Some potentials are applied respectively to the electrodes (by biasing means that are not shown), these potentials can continue to grow from one electrode to the next (biasing in a progressive manner) or these potentials may be equal in absolute values but have signs which alternate when changing from one electrode to the other.

In the semiconductor in zone II, the absorption of the light is translated by the creation of an electron-hole pair for each photon absorbed (whose energy is greater than the prohibited bandwidth or gap in the semiconductor). Under the effect of the electrical field, the electron is then attracted by that of the two electrodes closest to the electron, which has the highest potential and the hole by that of these two electrodes which has the lowest potential. This movement of the charges creates an electrical current in the electrodes.

The speed of the photodetector response depends on the distances between the electrodes and the potentials to which these electrodes are carried.

It should be noted that part of the incident light wave can be absorbed in the metal from which the electrodes are made. This absorption participates partially in the creation of carriers in the semiconductor elements 6: the excited electrons may pass over the potential barrier or else pass through a tunnel effect.

The different materials (metal for the electrodes, absorbent and non-absorbent semiconductors) are chosen according to the wavelength of the incident wave to be absorbed. For example, the metal electrodes may be made of silver, a metal whose reflective index (for bulk Ag) is high and which therefore allows a strong resonance to be obtained. Gold, platinum, aluminium or any other highly reflective metal may also be used. It should also be noted that the electrodes may be made up by two metals, for the reasons that will be examined later.

For an absorption of around 0.8 $\mu$m, GaAs is selected as the absorbent semiconductor and AlAs as the non-absorbent semiconductor (or, instead of AlAs, an $Al_xGa_{1-x}As$ material, with x being chosen in such a way that this material will not absorb the light for which the wavelength is predefined, but will allow a selective etching of the GaAs) and the Bragg mirror is formed by AlAs and $Al_{0.2}Ga_{0.47}As$. For an absorption of around 1.55 $\mu$m, $In_{0.53}Ga_{0.47}As$ is chosen as an absorbent semiconductor and InP as a non-absorbent semiconductor and the Bragg mirror is formed by GaInAsp/InP or by AlGaInAs/AlInAs.

On the other hand, the different parameters of the device e (width of the electrodes), d (pitch of the network) and h (height of the network, that is to say the thickness of the electrodes and of the semiconductor elements) as well as the thickness $h_m$ of the insulating layer 2, see FIG. 2, are adjusted in such a way as to excite either the surface plasmons for the TM polarisation or the TE modes, and in such a way as to obtain Fabry-Pérot resonance for these modes. It is also possible to choose these parameters so as to excite both types of modes simultaneously in an optimum manner.

It is preferentially required that the distance d–e between two adjacent electrodes (that is to say the width of each element) should range between $\lambda$ and 0.02×$\lambda$, where $\lambda$ is the wavelength of the light to be detected and that h is less than $\lambda/(2n)$, where n is the average refractive index of the elements 6. Thus a device is obtained with a low transit time and low capacity.

By way of an example, a number N of elements may be used, with 2≦N≦20, with the pitch d being included between 0.1×$\lambda$ and 1×$\lambda$.

At $\lambda$=0.8 $\mu$m and with the materials given above, total absorption is obtained (over 99%) for the TM polarised incident wave when choosing a network step of d=150 nm, an overlap rate (r=e/d) of r=0.5 (50%), a network height h of 55 nm and a Bragg mirror made up by 20 layers. The energy absorbed by the semiconductor in zone II is around 74%, with the remainder (26%) being absorbed by the metal.

The TE polarised incident wave is also totally absorbed when choosing d=150 nm, r=0.4 and h=305 nm. For a non-polarised wave, the choice of the parameters d=150 nm, r=0.5 and h=210 nm allows a reflection of the incident wave of 16% to be obtained and an absorption in the semiconductor of around 72%.

Figure 4:
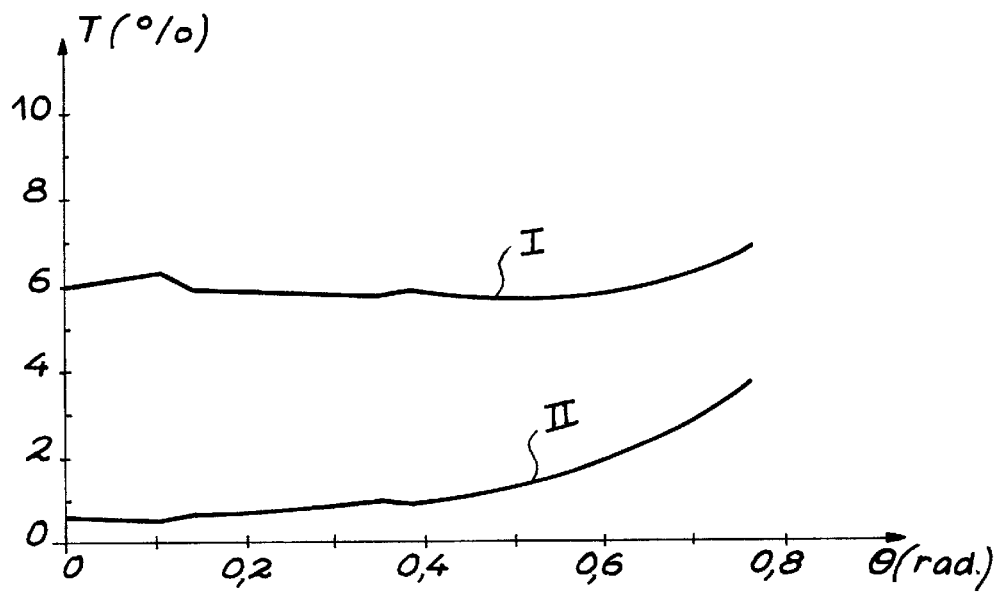
FIG. 4 shows the variations in the reflective index according to the angle of incidence for the light to be detected, for two different values of the network height formed by the elements and the electrodes from a device in accordance with the invention.
Figure 5:
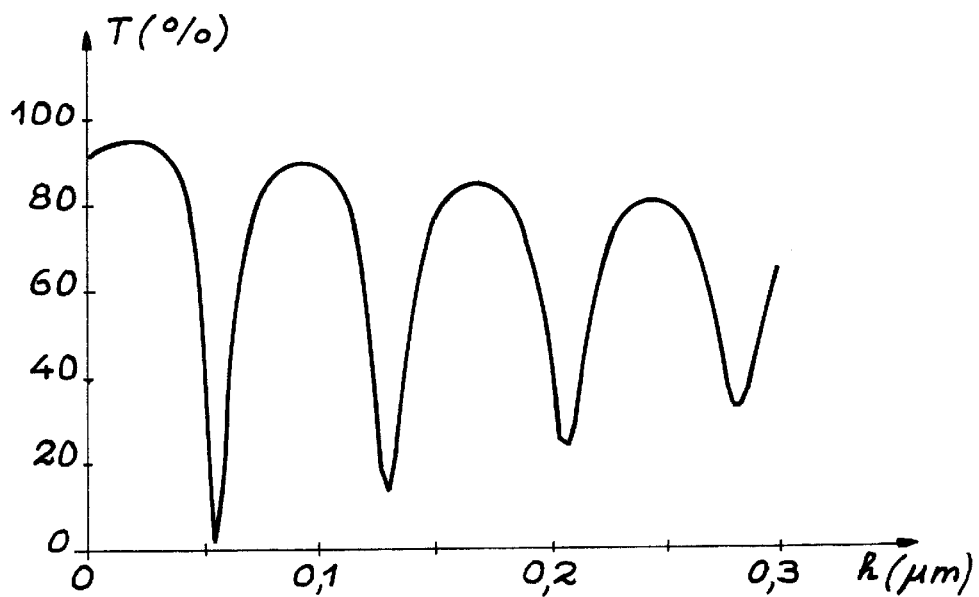
FIG. 5 shows the variations in the reflective index according to this height, in a device in accordance with the invention.

The curves in FIGS. 4 and 5 allow the yields of the devices that meet the invention to be characterised.

FIG. 4 shows the variations in the reflective rate T (in %) which is the ratio of the light intensity reflected by the device to the incident light intensity on this device versus on the incidence angle θ (in radians) that may be seen on FIG. 2, for the following values of the parameters: d=0.15 $\mu$m, r=0.5 and h=53 nm for curve I whilst it is h=55 nm for curve II.

FIG. 5 shows the variations in the reflective rate T (in %) versus the height h of the network (in $\mu$m) for d=0.15 $\mu$m, r=0.5 and θ=0° (normal incidence).

The manufacture of a device in accordance with the invention, for example the device in FIG. 2, is performed in five stages which are shown in a diagram form on FIGS. 6A to 6E.

Figure 6:
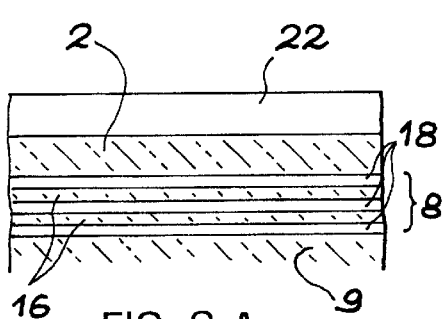
FIGS. 6A to 6E illustrate in a diagram form some variations for this procedure.
FIGS. 6F to 6H illustrate in a diagram form the stages of a procedure for manufacturing a device in accordance with the invention.
Figure 6:
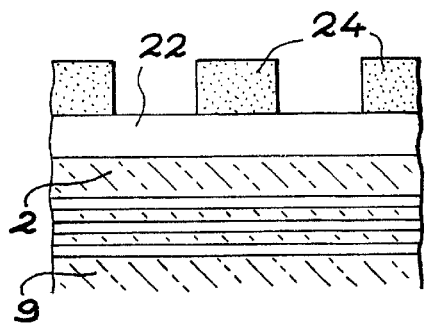
Figure 6:
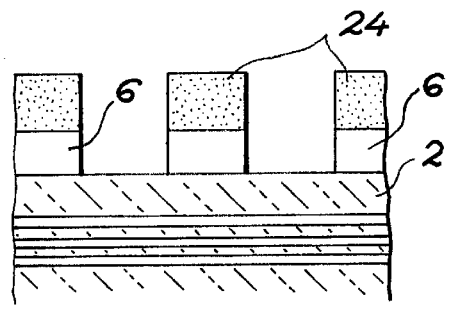
Figure 6:
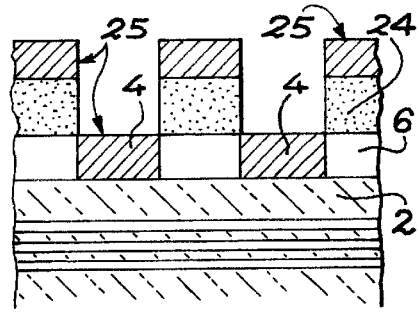

The layers 16 and 18 of the Bragg mirror, the layer 2 made of AlAs and the layer 22 made of GaAs which is on top of layer 2 (FIG. 6A) are made by means of epitaxy (for example, using molecular jet epitaxy) on a substratum 9 made of GaAs then an electronic masking of the network patterns (FIG. 6B) is made. Thus the zones corresponding to the electrodes are defined thanks to the deposits 24 of masking (for example, with deposits of PMMA). Then a reactive ionic etching of the layer made of GaAs is made (FIG. 6C). Finally, a deposit is made (FIG. 6D) under a vacuum of a layer 25 of silver to form the electrodes 4 then a lift off which leads to the structure in FIG. 6E.

The selective etching of the GaAs layer on AlAs is obtained thanks to the introduction of oxygen in the structure where the manufacture takes place: when the GaAs is etched, a fine layer of oxide is formed on the surface of the AlAs layer, it cuts down the etching speed considerably and allows the etching to be stopped on this layer. This selectivity may be generalised, for example, for InGaAs by introducing a layer of InAlAs.

The value for the parameter h (FIG. 2), whose role is crucial in resonance, is then controlled at the time of the epitaxy, to within about a single layer (0.5 nm).

Figure 6E:
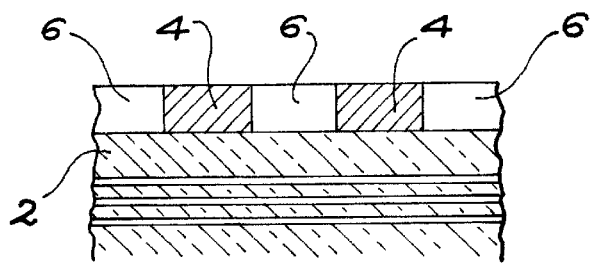
Figure 6F:
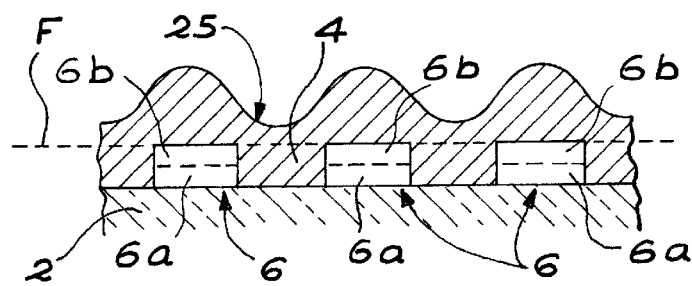

The metal deposit and lift-off stage may be replaced after having lifted off the deposits 24 (see FIG. 6F) by a metal deposit and a damascene, that is to say a mechanical or mechanical-chemical polishing of the metal whilst respecting the elements 6. The arrow F in FIG. 6F represents the limit for this polishing.

In order to make the selectivity of the polishing easier, each one of the elements 6 may be made up by a semiconductor layer 6a which absorbs the light to be detected and on which a dielectric layer 6b has been deposited in advance. This dielectric layer 6b may, for example, be made of silicon nitride $Si_3N_4$, whose polishing speed is very slow compared to that of metals, such as silver, which may be used. The dielectric layer leading to the set of layers 6b (and being used as a layer for stopping the polishing thanks to the great difference in hardness between the metal and the dielectric) may be deposited by sputtering after having made the absorbent semiconductor layer grow that leads to the set of layers 6a. Next, a mask is deposited, for example, made of nickel, which is used to protect the zones corresponding to the elements 6 during the course of the reactive ionic etchings in the dielectric layer (fluorous etchings, for example) then in the absorbent semiconductor layer (chlorinated etchings, for example).

Figure 7:
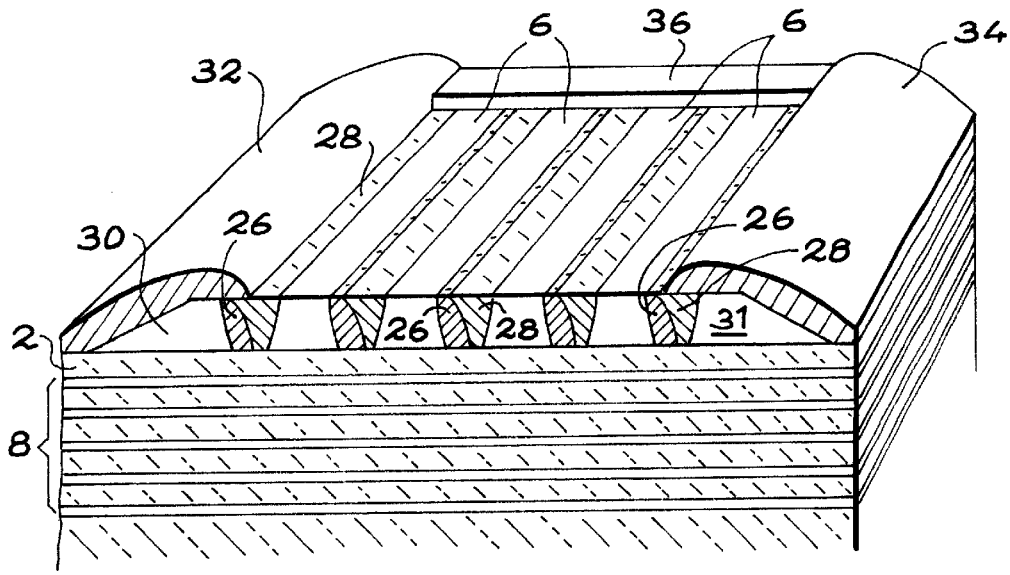
FIG. 7 is a diagram side view of another device in accordance with the invention.
Figure 6G:
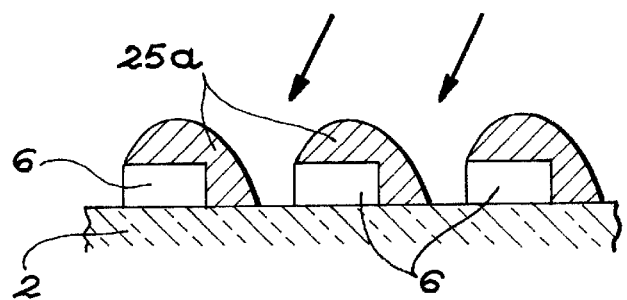
Figure 6H:
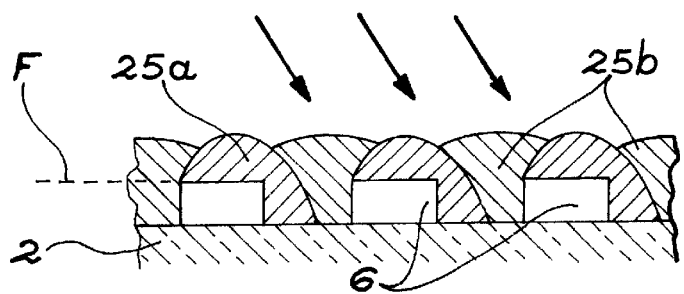

Should the metal deposit and the damascene work be carried out, two metal deposits 25a and 25b (see FIGS. 6G and 6H) with some sources inclined with respect to the substratum and using two different metals, allow the elements with two metals to be built (the case in FIG. 7).

The device that is the subject of the invention may be adapted to a large range of wavelengths, ranging from visible to infrared (several $\mu$m). On the other hand, it may be made with a large range of semiconductor materials.

It is possible to use different types of semiconductors in zone II (FIG. 2), for example, under the form of heterostructures (epitaxial layers) to enhance the transportation of the charges and the device's speed.

The calculations have shown that a trapezoidal or partly rounded section of the electrodes does not fundamentally change the device's functioning. On the other hand, the height h of the elements does play an important role.

Adding a dielectric layer to each element 6 does not modify the device's functioning in a fundamental way either, but the respective heights of the different layers must be redefined and play an important role.

It is also possible to use some dissymmetrical electrodes in order to favour the resonance on the most negative electrode and so to reduce the path for the slow charge carriers (the holes in the example being described) with respect to the path for the fast charge carriers (the electrons).

As has been seen, it is possible to use two different metals for the electrodes, with two independent objectives. One is similar to the preceding one and aims to favour the resonance on the most negative electrode whilst the other one aims to optimise the barrier heights for each one of the two types of carriers and therefore reduce the dark current.

The creation of carriers in the metal may take place for some photons with a lower energy than the prohibited bandwidth of the semiconductor for the elements 6 (larger wavelength), which increases the field for the application of the invention.

Another device in accordance with the invention is shown in perspective on FIG. 7. The insulating layer and the Bragg mirror 8 are to be seen again.

The elements 6 are seen as well. They are separated by electrodes each of which, in the example being described, is in two adjacent parts 26 and 28 which are respectively made of two different metals. It may be seen that an element 6 is contained between a part 26 and a part 28 and therefore between two different metals.

On FIG. 7, the references 30 and 31 represent some waste from the layer 22 at both ends of the device.

A cathode contact 32 and an anode contact 34 may be seen as well, which are respectively in contact with the electrodes at the ends. This anode contact and this cathode contact are linked to one another by means of a resistive element 36 that is in contact with each electrode and allows the potentials from these electrodes to be stabilised.

For the functioning of the device in FIG. 7, a voltage is applied between the contacts, 32 and 34.

What is claimed is:

1. Photodetection device configured to detect an incident light with a predefined wavelength, propagating in a propagation medium, comprising:

an electrically insulating layer that does not absorb the incident light; and at least one element, including a semiconductor material and at least two biasing electrodes, formed on the electrically insulating layer and configured to be carried to respective potentials that are different from one another, the at least two biasing electrodes surrounding the at least one element, a set formed by the at least one element and the at least two biasing electrodes configured to absorb the incident light, the at least one element and the at least two biasing electrodes having a shape that is substantially parallelepipedal and extending following a same direction, dimensions of the at least two biasing electrodes and the at least one element, measured transversally to the same direction, being chosen, as a function of the predefined wavelength, to increase light intensity in the set formed by the at least one element and the at least two biasing electrodes, with respect to the incident light, making at least one of two modes resonate, including a first surface plasmon mode that is made to resonate between interfaces that the set includes with an insulating layer and a propagation medium, resonance of the first mode taking place at an interface between the at least one element and at least one of the at least two biasing electrodes, the first mode being excited by a component of a magnetic field associated with the incident light, a component that is parallel to the at least two biasing electrodes, and a second transverse electrical mode of an optical wave guide perpendicular to the insulating layer and that includes the at least two biasing electrodes, the second mode being excited by the component of the electrical field associated with the incident light, and the component is parallel to the at least two biasing electrodes.

2. Device according to claim 1, wherein the surface plasmon mode is made to resonate and a width of each of the at least one element, measured perpendicularly to the same direction, is less than $\lambda$ and higher than $0.02 \times \lambda$, where $\lambda$ is a wavelength of the incident light and a thickness of each of the at least one element is less than $\lambda/(2n)$, where n is an average refractive index for each of the at least one element.

3. Device according to claim 1, wherein the at least two biasing electrodes are made of a same electrically conductive material and are a same height, measured perpendicularly to the insulating layer.

4. Device according to claim 1, wherein the at least two biasing electrodes are at least one of (a) made of different electrically conductive materials, or (b) have different heights, measured perpendicularly to the insulating layer, in such a way that the resonance takes place essentially on a side of the at least two biasing electrodes that collect slow charge carriers at a time of the biasing of the at least two biasing electrodes.

5. Device according to claim 1, wherein the at least one element includes a semiconductor heterostructure.

6. Device according to claim 1, configured to detect incident light whose wavelength belongs to infrared range, wherein the at least two biasing electrodes are mainly made of Ag or Au to absorb the incident light, and the at least one element not absorbing the incident light.

7. Device according to claim 1, wherein the propagation medium is air.

8. Device according to claim 1, wherein the propagation medium is a light guide parallel to the same direction along which the at least two biasing electrodes of each at least one element extends.

9. Device according to claim 1, including plural of the at least one element and electrodes that alternate on the insulating layer, with each electrode being made of a single metal or of two different metals.

10. Device according to claim 9, wherein the electrodes are configured to be carried to potentials that increase from one end electrode to another end electrode in a set of electrodes.

11. Device according to claim 10, further comprising a resistive material, for stabilizing potentials, in contact with the electrodes and running from the one end electrode to the other end electrode in the set of electrodes.

12. Device according to claim 9, wherein the at least two biasing electrodes are configured to be carried to potentials whose absolute values are equal and whose signs alternate.

13. Device according to claim 1, further comprising means for reflection for reflecting light that is not absorbed, crossing the insulating layer, with a thickness of the insulating layer being chosen so that the light reflected by the means for reflection will be in phase with light waves present in the set formed by each at least one element and the at least two biasing electrodes and will participate in the resonance.

14. Device according to claim 13, configured to detect incident light whose wavelength is approximately 0.8 μm, the device being formed on a substratum of GaAs, the at least one element being made of GaAs, the at least two biasing electrodes being made of Ag, the insulating layer being made of AlAs, or out of an $Al_xGa_{1-x}$ material, with x being chosen such that this material will not absorb the incident light but will allow a selective etching of the GaAs, and the means for reflection being a multiple layer AlAs/AlGaAs mirror.

15. Device according to claim 13, configured to detect incident light whose wavelength is approximately 1.55 μm, the device being formed on a substratum made of InP, the at least one element is made of InGaAs, the at least two biasing electrodes are made of Ag, the insulating layer is made of AlInAs, and the means for reflection is a multiple layer mirror made of GaInAsP/InP or AlGaInAs/AlInAs.

16. Device according to claim 13, configured to detect incident light whose wavelength is approximately 1.55 μm, the device is formed on a substratum made of GaAs, with the at least one element being made of an InGaAsNSb alloy, the at least two biasing electrodes are made of Ag, the insulating layer is made of AlAs, or in an $Al_xGa_{1-x}As$ material, with x being chosen such that this material will not absorb the incident light but will allow a selective etching of the GaAs, and the means for reflection is a multiple layer GaAs/AlAs mirror.

17. Procedure for manufacturing the photodetection device according to claim 23, wherein a given thickness of the semiconductor material of the at least one element is made to grow on the insulating layer, the semiconductor material is etched selectively to remove portions in sites corresponding to the at least two biasing electrodes and the at least two biasing electrodes are formed on the sites.

18. Procedure according to claim 17, wherein a same mask is used to selectively etch the at least one element, then to form the at least two biasing electrodes.

19. Procedure according to claim 17, wherein a same mask is used to selectively etch the at least one element, the mask is removed, the at least two biasing electrodes are formed using at least one metal, and excess material from this at least one metal is removed by mechanical or mechanical-chemical polishing.

20. Procedure according to claim 19, wherein the excess material is removed by a selective mechanical or mechanical-chemical polishing of the at least one metal with respect to the at least one element, with the at least one element comprising a material whose hardness is greater than that of the at least one metal.

21. Procedure according to claim 19, wherein the at least one element includes an upper layer and the excess material is removed by a selective mechanical or mechanical-chemical polishing of the at least one metal with respect to the at least one element, with the upper layer of the at least one element comprising a material whose hardness is greater than that of the at least one metal.

22. Procedure according to claim 19, wherein two metals are used to form the at least two biasing electrodes, and are deposited successively in an oblique manner with respect to the insulating layer.

* * * * *